(12) United States Patent
Mizutani

(10) Patent No.: US 7,733,716 B2
(45) Date of Patent: Jun. 8, 2010

(54) SIGNAL MASKING METHOD, SIGNAL MASKING CIRCUIT, AND SEMICONDUCTOR INTEGRATED CIRCUIT

(75) Inventor: Kouji Mizutani, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 189 days.

(21) Appl. No.: 12/126,358

(22) Filed: May 23, 2008

(65) Prior Publication Data

US 2008/0291757 A1  Nov. 27, 2008

(30) Foreign Application Priority Data

May 24, 2007  (JP) .............................. 2007-138219

(51) Int. Cl.
*G11C 7/00* (2006.01)
*G11C 8/00* (2006.01)

(52) U.S. Cl. ..................... 365/193; 365/194; 365/196; 365/233.1; 365/233.5; 365/236

(58) Field of Classification Search ....................... None

See application file for complete search history.

(56) References Cited

U.S. PATENT DOCUMENTS

| 7,298,188 | B2 | 11/2007 | Kawasaki | |
|---|---|---|---|---|
| 2009/0043955 | A1* | 2/2009 | Butt et al. | 711/105 |
| 2009/0240968 | A1* | 9/2009 | Kizer et al. | 713/401 |

FOREIGN PATENT DOCUMENTS

JP  2006-107352 A  4/2006

* cited by examiner

*Primary Examiner*—Ly D Pham
(74) *Attorney, Agent, or Firm*—Arent Fox LLP.

(57) ABSTRACT

A signal masking circuit includes a detection circuit, a delayed read data strobe signal generation circuit, a gating circuit, a counting circuit, and a masking circuit. The detection circuit detects a period of a logic "L" of a read data strobe signal. The gating circuit gates a delayed read data strobe signal, and generates a first masked read data strobe signal. The counting circuit counts the falls of the first masked read data strobe signal until the count reaches a predetermined number, and generates a masking signal for masking the first masked read data strobe signal. The masking circuit masks the first masked read data strobe signal, and outputs a second masked read data strobe signal.

14 Claims, 8 Drawing Sheets

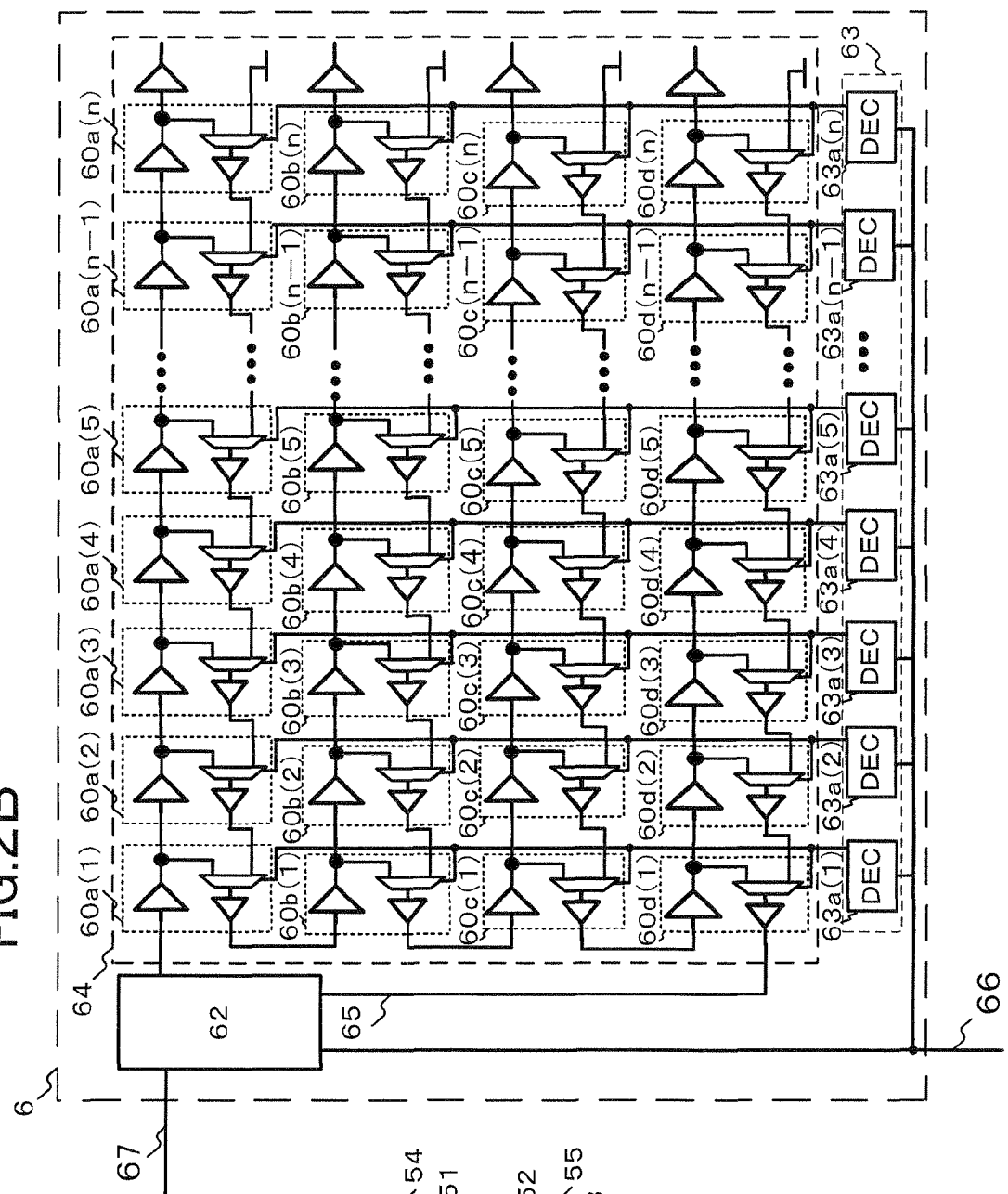
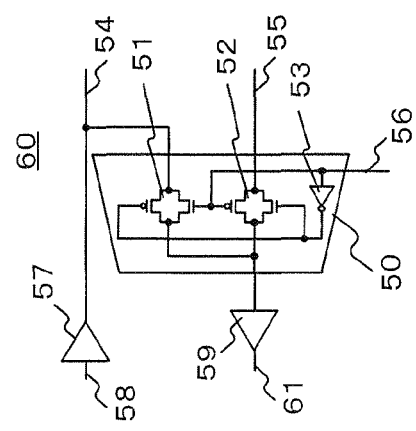

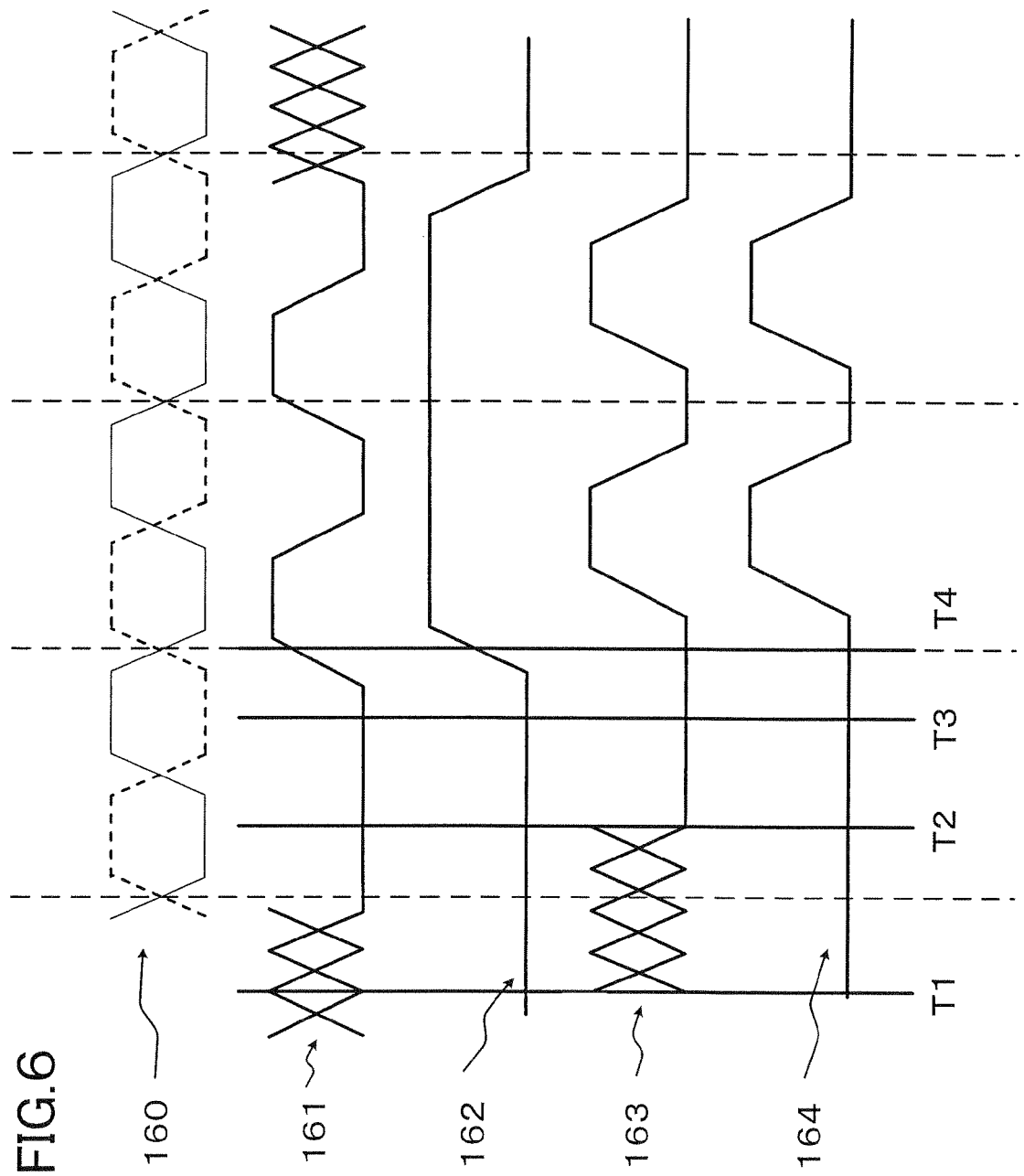

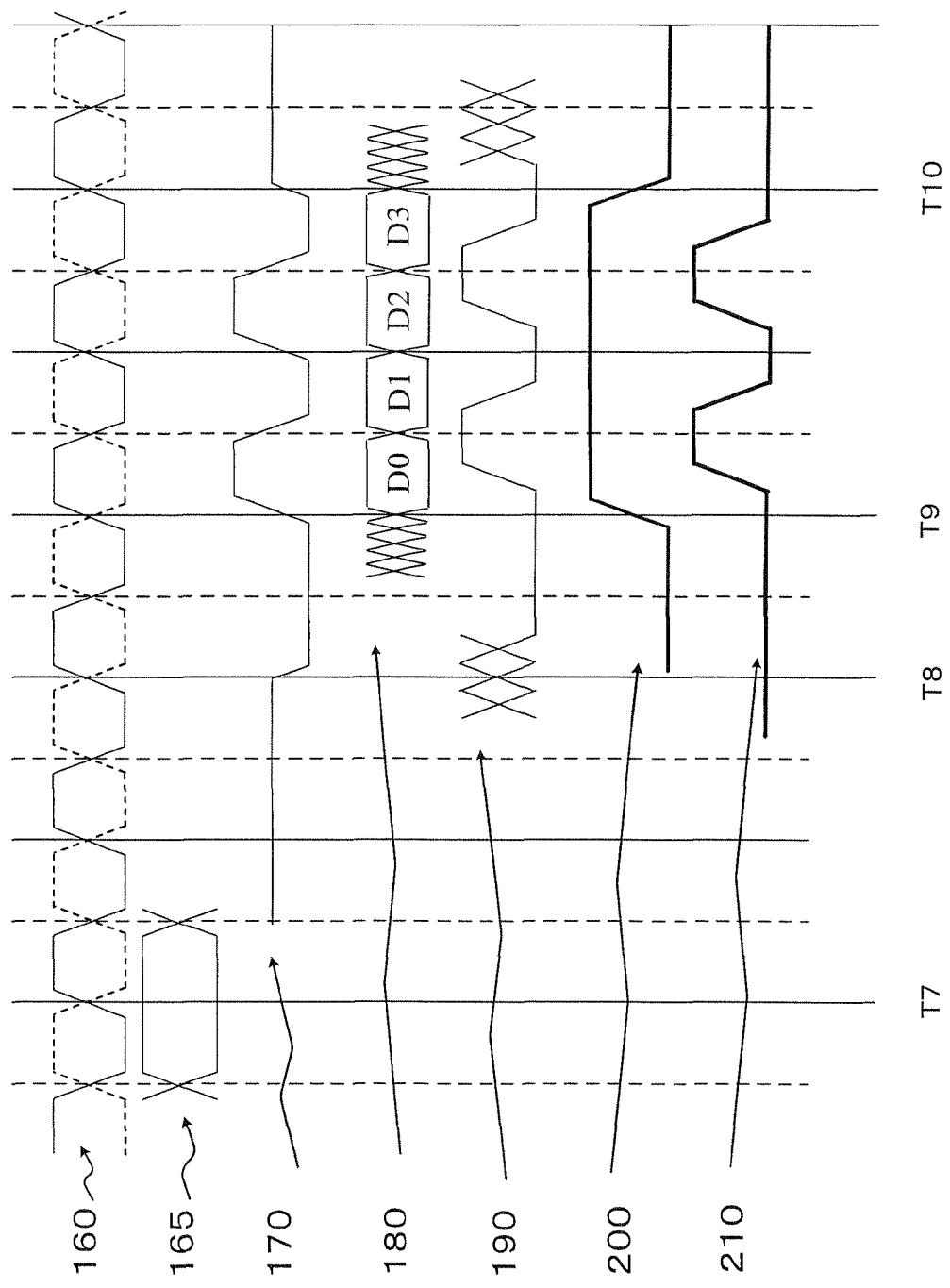

SIGNAL MASKING METHOD, SIGNAL MASKING CIRCUIT, AND SEMICONDUCTOR INTEGRATED CIRCUIT

TECHNICAL FILED

This is related to a signal masking method, a signal masking circuit, and a semiconductor integrated circuit mounted with the circuit, and particularly to a signal masking method and a signal masking circuit for masking a bus signal output from a DRAM (Dynamic Random Access Memory) and a semiconductor integrated circuit mounted with the circuit.

BACKGROUND

An increase in the speed of data transfer in a semiconductor integrated circuit has been attempted by causing a data signal to be transferred in synchronization with a clock signal between a logic circuit and an SDRAM (Synchronous Dynamic Random Access Memory) which is a semiconductor memory operating in synchronization with a clock signal.

Further, to increase the transfer speed, a DDR SDRAM (Double Data Rate Synchronous Dynamic Random Access Memory) has been increasingly used which outputs data both at the rise and fall of the clock signal.

The output period of read data output by the DDR SDRAM is half the cycle of the clock signal, and thus the data is transferred at a high speed. Meanwhile, a skew between signals is always an issue to be addressed in a parallel interface as used in the DDR SDRAM. Along with the increase in the transfer speed, therefore, it becomes difficult to capture the read data.

Therefore, the DDR SDRAM outputs the read data together with a read data strobe (RDQS) signal synchronized with the read data. That is, the DDR SDRAM outputs the read data in a so-called source synchronous transfer. The logic circuit acquires the read data in accordance with a signal generated from the read data strobe (RDQS) signal. In this configuration, the read data and the read data strobe (RDQS) signal are synchronized with each other. Thus, the phase between the signals becomes substantially constant. Accordingly, the period for defining the read data is not reduced.

Thereafter, to enable the logic circuit to use the read data acquired in accordance with the read data strobe (RDQS) signal, the read data needs to be passed to a storage circuit, such as a flip-flop circuit, which is synchronized with the clock signal.

Therefore, the read data and the read data strobe (RDQS) signal are input to a data terminal and a clock terminal of the flip-flop circuit, respectively, and the read data is latched. Then, the latched data is input to the flip-flop circuit of the next stage. Further, the clock signal used in the logic circuit is input to a clock terminal of the flip-flop circuit, and the latched data is latched.

Herein, it is assumed that a signal line for transmitting the read data strobe (RDQS) signal to the logic circuit is connected to a plurality of semiconductor memories. In this configuration, when the DDR SDRAM outputs the read data strobe (RDQS) signal, the DDR SDRAM drives the signal line for transmitting the read data strobe (RDQS) signal only during the output period of the read data, and does not drive the signal line during the other period. That is, the read data strobe (RDQS) signal is a so-called bus signal. Therefore, the logic of the read data strobe (RDQS) signal is defined during a period of the read data strobe (RDQS) signal effective for receiving the read data, an approximately one cycle period of a logic "L (Low)" preceding the first rise of the read data strobe (RDQS) signal effective for receiving the read data (a so-called read preamble), and an approximately 0.5 cycle period of the logic "L" subsequent to the last fall of the read data strobe (RDQS) signal (a so-called read postamble). In the other period, the read data strobe (RDQS) signal is in a Hi-Z (high impedance) state. In the simple configuration which connects the read data strobe (RDQS) signal to the clock terminal of the flip-flop circuit that latches the read data, therefore, if a pulse coincides with the Hi-Z state of the read data strobe (RDQS) signal when the read data captured in accordance with the read data strobe (RDQS) signal is passed to an internal logic circuit, the captured data may be destroyed.

In view of the above, a semiconductor integrated circuit has been proposed which includes a delay circuit for receiving the input of the read data strobe (RDQS) signal and generating a first timing signal for latching the read data at the flip-flop circuit and a signal defined state maintaining circuit for maintaining, in accordance with a second timing signal generated from the first timing signal, the output from the flip-flop circuit which has latched the read data (e.g., Japanese Laid-open Patent Publication No. 2006-107352). The read data is maintained in the flip-flop circuit for a predetermined period even after the shift of the read data strobe (RDQS) signal to the Hi-Z state. It is therefore possible to ensure a period until the latch of the read data by the flip-flop circuit of the next stage input with the clock signal in the clock terminal thereof. Accordingly, the read data is maintained even if the read data strobe (RDQS) signal falls into the Hi-Z state at the time of inhibiting the input to an input circuit of the read data strobe (RDQS) signal (i.e., at the time of masking).

However, if the read data strobe (RDQS) signal is in the Hi-Z state at the time of permitting the input to the input circuit of the read data strobe (RDQS) signal (i.e., at the time of gating) after the input operation of the read data to the flip-flop circuit has been notified, the flip-flop circuit latches incorrect read data.

As described above, the timing of masking and gating the read data strobe (RDQS) signal deviates from the effective period of the read data strobe (RDQS) signal effective for receiving the read data, the read preamble, and the read postamble for the following reasons. That is, in a period in which the clock signal of the logic circuit is transmitted to the DDR SDRAM and the read data strobe (RDQS) signal is propagated to the logic circuit, a signal delay on the path (i.e., a so-called flight time) is not constant with respect to the timing of masking and gating performed in accordance with the clock signal of the logic circuit, due to a variety of variation factors such as input-output circuit characteristics of the logic circuit, a transmission path delay, and DRAM characteristics. Therefore, the arrival timing of the read data strobe (RDQS) signal to the logic circuit is not constant.

To prevent the flip-flop circuit from latching the incorrect read data, it is conceivable to set the timing of masking and gating the read data strobe (RDQS) signal within the effective period of the read data strobe (RDQS) signal effective for receiving the read data, the read preamble, and the read postamble. However, the signal delay (the flight time) is not constant. Therefore, there arises a case in which the effective period of the read data strobe (RDQS) signal effective for receiving the read data is reduced.

The path for generating the read data strobe (RDQS) signal is constituted by the logic circuit for generating the clock signal, a transmission path of the clock signal, a circuit in the DDR SDRAM for generating the clock signal, a circuit in the DDR SDRAM for generating the read data strobe (RDQS) signal, a transmission path of the read data strobe (RDQS)

signal, and a circuit in the logic circuit for receiving the read data strobe (RDQS) signal. Thus, the variation in the amount of the signal delay varies among the respective sections of the path. Accordingly, it is substantially difficult to make the signal delay (the flight time) of the whole path constant.

SUMMARY

According to one aspect of the embodiments, a signal masking circuit includes a detection circuit, a delayed read data strobe signal generation circuit, a gating circuit, a counting circuit, and a masking circuit. The detection circuit detects a period of a logic "L" preceding a period of a read data strobe signal effective for receiving read data, and generates a gating signal when the period of the logic "L" is equal to or longer than a predetermined period. The delayed read data strobe signal generation circuit generates a delayed read data strobe signal by delaying the read data strobe signal. Upon receipt of the gating signal, the gating circuit gates the delayed read data strobe signal, and generates a first masked read data strobe signal. After the gating, the counting circuit counts the falls of the first masked read data strobe signal until counts reaches a predetermined number, and thereafter generates a masking signal for masking the first masked read data strobe signal. Upon receipt of the masking signal, the masking circuit masks the first masked read data strobe signal, and outputs a second masked read data strobe signal.

BRIEF DESCRIPTION OF THE DRAWINGS

FIGS. 2A and 2B are circuit diagrams illustrating a DLL circuit constituting a measurement circuit;

FIG. 6 is a diagram for explaining operations of the signal masking circuit;

FIG. 8 illustrates operation waveforms of a DRAM and the memory interface circuit.

DESCRIPTION OF THE PREFERRED EMBODIMENT

A first embodiment will be described below. The present invention, however, is not limited to the first embodiment.

First Embodiment

The first embodiment relates to a memory interface circuit 4. The first embodiment will be described with reference to FIGS. 1 to 8.

Figure 1:
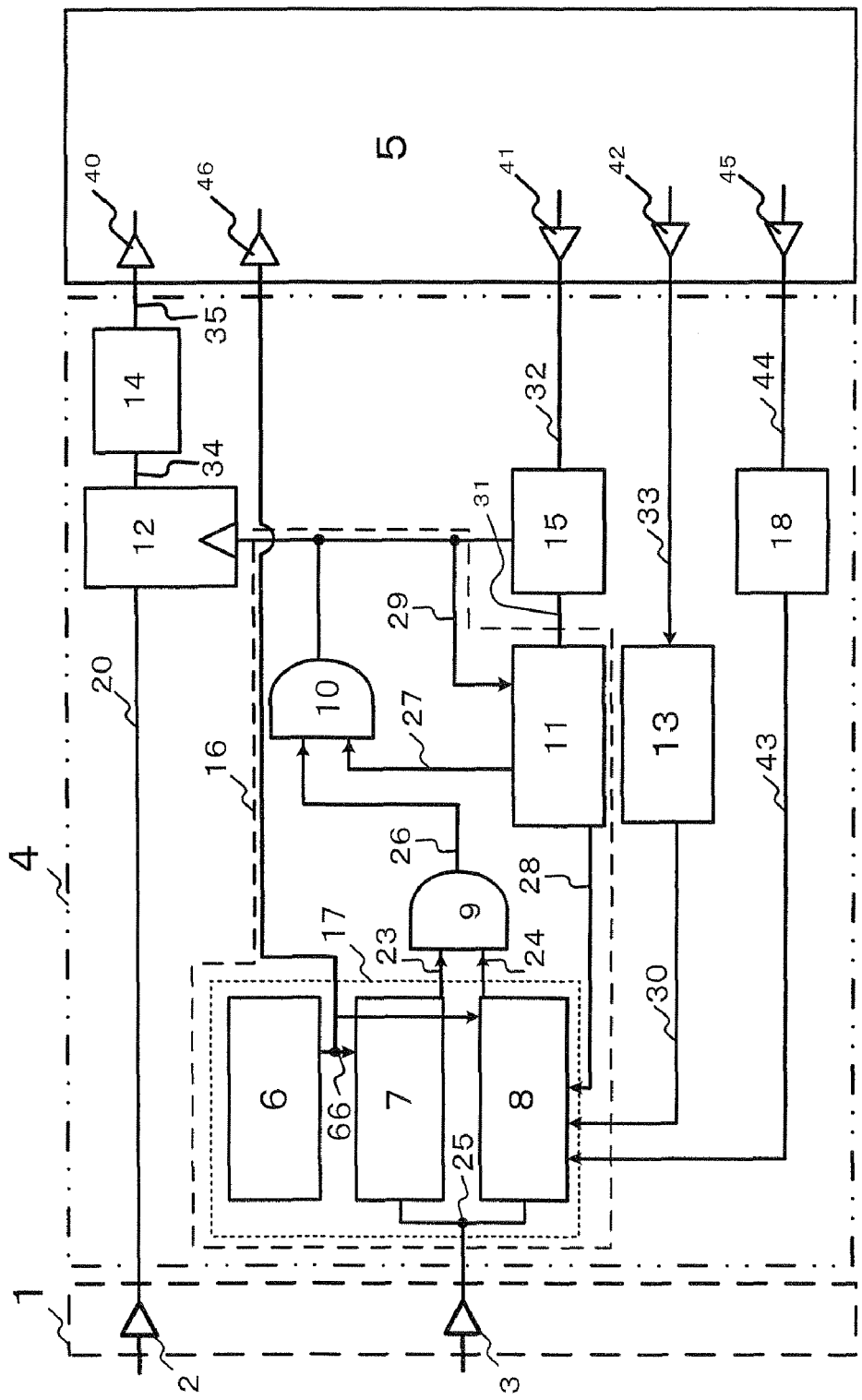
FIG. 1 is a circuit diagram for explaining an overview of a memory interface circuit.

FIG. 1 is a circuit diagram for explaining an overview of the memory interface circuit 4. Further, FIG. 1 illustrates that, upon receipt of data (DQ) 20 and a read data strobe (RDQS) signal 25 output from a DRAM 1, the memory interface circuit 4 acquires the data (DQ) 20 in accordance with the read data strobe (RDQS) signal 25, and outputs to a DRAM controller 5 data (DQB) 35 latched in synchronization with a clock signal 67.

The DRAM 1 constitutes a storage circuit for storing data. The DRAM 1 receives a write command signal, and stores write data input simultaneously with the write command signal in a storage element corresponding to an address input simultaneously with the write command signal. Further, the DRAM 1 receives a read command signal, and outputs read data stored in a storage element corresponding to an address input simultaneously with the read command signal.

The DRAM 1 is a standard DDR SDRAM. According to a standard specification of the DRAM 1, the data (DQ) 20 is output from a data input-output terminal by a data output buffer 2, and the read data strobe (RDQS) signal 25 is output from a read data strobe output terminal by a read data strobe output buffer 3. The other circuits and memory elements of the DRAM 1 are unnecessary for the explanation of the memory interface circuit 4, and thus are omitted. Needless to say, however, the DRAM 1 is mounted with the other circuits for satisfying the other specifications of the standard DDR SDRAM.

The DRAM controller 5 constitutes a circuit for controlling the DRAM 1 and controlling the output of the read data (DQ) 20 and the input of the write data. In the DRAM controller 5, a data input buffer 40 receives the data (DQB) 35. Further, in the DRAM controller 5, a control signal output buffer 41 outputs a control signal 32, and a pre-start signal output buffer 42 outputs a pre-start signal 33. Further, in the DRAM controller 5, a decoding signal input buffer 46 receives a decoding signal 66 from a DLL (Delay Lock Loop) circuit 6, and on the basis of the information of the signal, a pre-Th signal output buffer 45 outputs a pre-Th signal 44. Further, the DRAM controller 5 includes circuits for controlling the standard DDR SDRAM. Needless to say, the DRAM controller 5 is mounted with such circuits as a circuit for generating and outputting a command such as the write command or the read command and a circuit for generating and outputting the address input simultaneously with the write command or the like, for example, although the circuits are unnecessary for the explanation of the memory interface circuit 4 and thus are not illustrated. The control signal 32, the pre-start signal 33, the decoding signal 66, and the pre-Th signal 44 will be described later.

The memory interface circuit 4 is constituted by a signal masking circuit 16, a flip-flop circuit 12, a signal delay circuit DLB 13, and FIFO (First In First Out) circuits 14, 15, and 18.

The signal masking circuit 16 has a function of receiving the read data strobe (RDQS) signal 25, masking the read data strobe (RDQS) signal 25 during a period in which the logic of the read data strobe (RDQS) signal 25 is undefined, i.e., a Hi-Z period, and outputting a masked read data strobe (MRDQS) signal 29 in which the signal logic during the period has been converted into a logic "L." Detailed operations and functions of the signal masking circuit 16 will be described later.

The signal masking circuit 16 is constituted by a measurement circuit 17, AND circuits 9 an 10, and a counter 11.

The measurement circuit 17 is constituted by the DLL circuit 6, a read data strobe signal delay circuit DLA 7, and a detection circuit 8. Details of the DLL circuit 6, the read data strobe signal delay circuit DLA 7, and the detection circuit 8 will be described later. Detailed operations and functions of the measurement circuit 17 will also be described later.

The measurement circuit 17 receives the read data strobe (RDQS) signal 25 from the DRAM 1. Further, the measurement circuit 17 outputs to an input terminal of the AND circuit 9 a delayed signal A23 delayed from the read data strobe (RDQS) signal 25 by a quarter phase. Further, the measurement circuit 17 outputs to the other input terminal of the AND circuit 9 a gating signal B24 synchronized with the rise of the read data strobe (RDQS) signal 25. The measurement circuit 17 starts a detection operation upon receipt of a start signal 30 from the signal delay circuit DLB 13. Further, the measurement circuit 17 is reset upon receipt of a reset signal 28 from the counter 11. Further, upon receipt of a Th signal 43 for determining a threshold value of the logic "L" period of the read data strobe (RDQS) signal 25 to be detected, the measurement circuit 17 determines the threshold value of the logic "L" period.

The AND circuit 9 receives the delayed signal A23 and the gating signal B24 at the input terminals thereof, and outputs to an input terminal of the AND circuit 10 a delayed signal C26 delayed from the read data strobe (RDQS) signal 25 by a quarter phase.

The signal delay circuit DLB 13 receives the pre-start signal 33 output from the DRAM controller 5, and outputs the start signal 30 by delaying the pre-start signal 33 by a predetermined phase.

In accordance with the rise of the clock signal 67, The FIFO circuit 15 latches the control signal 32 output from the DRAM controller 5, and outputs a control signal 31 to the counter 11 at the rise of the masked read data strobe (MRDQS) signal 29. The control signal 31 includes a plurality of signals including at least a counter reset signal 98, a BL2(100) signal, a BL4(102) signal, and a BL8(104) signal, as will be described later.

The AND circuit 10 receives the delayed signal C26 at an input terminal thereof and an END signal 27 at the other input terminal thereof, and outputs the masked read data strobe (MRDQS) signal 29.

After receipt of the control signal 31, the counter 11 transmits the reset signal 28 to the measurement circuit 17. Further, the counter 11 receives the masked read data strobe (MRDQS) signal 29, and counts the falls of the masked read data strobe (MRDQS) signal 29 until the count reaches a predetermined number. Thereafter, in synchronization with the fall of the masked read data strobe (MRDQS) signal 29, the counter 11 outputs to the AND circuit 10 the END signal 27 for stopping the gating of the delayed signal C26.

In accordance with the rise of the masked read data strobe (MRDQS) signal 29, the flip-flop circuit 12 latches the read data (DQ) 20, and outputs data (DQA) 34.

The FIFO circuit 14 latches the data (DQA) 34 in accordance with the rise of the clock signal 67, and outputs the data (DQB) 35 at the rise of the clock signal 67.

The FIFO circuit 18 receives from the DRAM controller 5 the pre-Th signal 44 for determining the threshold value of the logic "L" period of the read data strobe (RDQS) signal 25 to be detected, and latches the signal in synchronization with the clock signal 67. Then, at the rise of the clock signal 67, the FIFO circuit 18 outputs to the measurement circuit 17 the Th signal 43 for determining the threshold value of the logic "L" period of the read data strobe (RDQS) signal 25 to be detected.

FIGS. 2A and 2B are circuit diagrams illustrating the DLL circuit 6 constituting the measurement circuit 17. Herein, FIG. 2A illustrates a circuit unit 60 constituting the DLL circuit 6. The circuit unit 60 is constituted by switch circuits 51 and 52, an inverter 53, an output signal DELOUT 54, an input signal DELIN 55, a selection signal SELIN 56, signal amplifiers 57 and 59, a signal CLKIN 58, and a signal CLKOUT 61. In the drawings described hereinafter, a trapezoidal symbol representing a switch circuit indicates a switch circuit 50 constituted by the switch circuits 51 and 52 and the inverter 53.

The circuit unit 60 amplifies and outputs the signal CLKIN 58 as the output signal DELOUT 54. Further, if the logic of the selection signal SELIN 56 is "H (High)," the circuit unit 60 amplifies and outputs the output signal DELOUT 54 as the signal CLKOUT 61. Further, if the logic of the selection signal SELIN 56 is "L," the circuit unit 60 amplifies and outputs the input signal DELIN 55 as the signal CLKOUT 61.

FIG. 2B is a circuit diagram illustrating the DLL circuit 6. The DLL circuit 6 is constituted by a phase comparison circuit 62, a delay circuit 64 constituted by a plurality of the circuit units 60 connect to one another, and a selection circuit 63.

The delay circuit 64 is constituted by one row of circuit units 60a(1) to 60a(n), one row of circuit units 60b(1) to 60b(n), one row of circuit units 60c(1) to 60c(n), and one row of circuit units 60d(1) to 60d(n), i.e., four rows of the series-connected circuit units 60. The delay circuit 64 constitutes a circuit for providing a phase delay to the clock signal 67, i.e., a circuit for receiving the clock signal 67 and outputting a delayed clock signal 65 to the phase comparison circuit 62.

The selection circuit 63 is constituted by decoding circuits 63a(1) to 63a(n). The decoding circuits 63a(1) to 63a(n) generates the selection signal SELIN 56, and determines the column of the circuit units 60 contributing to the phase delay of the clock signal 67. For example, if the selection signal SELIN 56 is generated from the decoding circuit 63a(1), the column including the circuit units 60a(1) to 60d(1) contributes to the delay of the clock signal 67. That is, if the selection signal SELIN 56 is generated from a decoding circuit 63a(m) (m represents an integer number selected from 1 to m), the circuit units 60a (1) to 60a (m), 60b (1) to 60b (m), 60c (1) to 60c (m), and 60d(1) to 60d(m) contribute to the delay of the clock signal 67. That is, with reference to FIG. 2B, the clock signal 67 passes through from the amplifier in the upper stage of the circuit unit 60a(1) (corresponding to the signal amplifier 57 of the circuit unit 60) to the amplifier in the upper stage of the circuit unit 60a(m), and then from the amplifier in the lower stage of the circuit unit 60a(m) (corresponding to the signal amplifier 59 of the circuit unit 60) to the amplifier in the lower stage of the circuit unit 60a(1). Thereafter, in a similar manner, the clock signal 67 passes through the amplifiers in the upper stage and the amplifiers in the lower stage of the respective circuit units 60b(1) to 60b(m). Then, in a similar manner, the clock signal 67 passes through the amplifiers in the upper stage and the amplifiers in the lower stage of the respective circuit units 60c(1) to 60c(m). Thereafter, in a similar manner, the clock signal 67 passes through the amplifiers in the upper stage and the amplifiers in the lower stage of the respective circuit units 60d(1) to 60d(m). Thereby, the clock signal 67 is propagated to the phase comparison circuit 62 as the delayed clock signal 65.

The phase comparison circuit 62 constitutes a circuit for comparing the phase of the clock signal 67 with the phase of the delayed clock signal 65 output via the delay circuit 64. On the basis of the result of the comparison, the phase comparison circuit 62 generates the decoding signal 66 for activating the decoding circuit 63a(m) (m represents an integer number selected from 1 to m) of the selection circuit 63 such that the phase of the delayed clock signal 65 delayed by one clock cycle matches the phase of the clock signal 67. The decoding signal 66 is an 8-bit digital signal for selecting the decoding circuit 63a(m) (m represents an integer number selected from 1 to m) of the selection circuit 63. That is, the digital signal includes information on the number of elements corresponding to one cycle of the clock signal 67. This is because, if a circuit unit 60d(2) is selected by a digital signal "01000000," for example, the number of the circuit units 60 passed through by the clock signal 67 since the input of the signal until the return of the signal to the phase comparison circuit 62 is uniquely determined to be eight. In this case, the number of stages of the amplifiers passed through by the clock signal 67 is sixteen. This is because each of the circuit units 60 includes two stages of the signal amplifiers 57 and 59.

With reference to FIG. 2B, the operations of the DLL circuit 6 will be described. The phase comparison circuit 62 compares the phase of the clock signal 67 input to the delay circuit 64 and the phase of the delayed clock signal 65. Then, if it is determined from the result of the comparison that the phase of the delayed clock signal 65 is faster, the phase comparison circuit 62 outputs the decoding signal 66 for activating one of the decoding circuits 63a(1) to 63a(n) so as to increase the number of the circuit units 60 passed through by the clock signal 67. Meanwhile, if the phase of the delayed clock signal 65 is slower, the phase comparison circuit 62 outputs the decoding signal 66 for activating one of the decoding circuits 63a(1) to 63a(n) so as to reduce the number of the circuit units 60 passed through by the clock signal 67. Further, if the phase of the delayed clock signal 65 matches the phase of the clock signal 67, the phase comparison circuit 62 maintains the decoding signal 66 having the same digits as the digits of the decoding signal 66 generated prior to the phase comparison.

Thereby, the number of the circuit units 60 causing the delay of one cycle of the clock signal 67 can be determined from the digits included in the decoding signal 66, regardless of the condition of the power supply which drives the circuit units 60. Accordingly, upon receipt of the decoding signal 66, the memory interface circuit 4 can recognize the number of stages of the amplifiers (the signal amplifiers 57 and 59 of the circuit units 60) corresponding to one cycle of the clock signal 67. In a so-called best condition, the number of the circuit units 60 contributing to the delay of the clock signal 67 in the delay circuit 64 is increased. This is because the signal delay due to the signal amplifiers 57 and 59 of the circuit units 60 is reduced. In a so-called worst condition, the number of the circuit units 60 contributing to the delay of the clock signal 67 in the delay circuit 64 is reduced. This is because the signal delay due to the signal amplifiers 57 and 59 of the circuit units 60 is increased. The best condition refers to the condition in which the power supply voltage supplied to a circuit is the upper limit of the rated value of the voltage. Meanwhile, the worst condition refers to the condition in which the power supply voltage supplied to a circuit is the lower limit of the rated value of the voltage. The above is the basic functions of the DLL circuit 6. As the number of chain stages of buffers in the circuit units 60 of the DLL circuit 6 and the value of the delay per stage caused by the buffers are reduced, the resolution implemented as a delay adjustment function is improved. Accordingly, a response to a faster interface is enabled. Obviously, the present invention is not limited to a special DLL circuit configuration.

Figure 3:
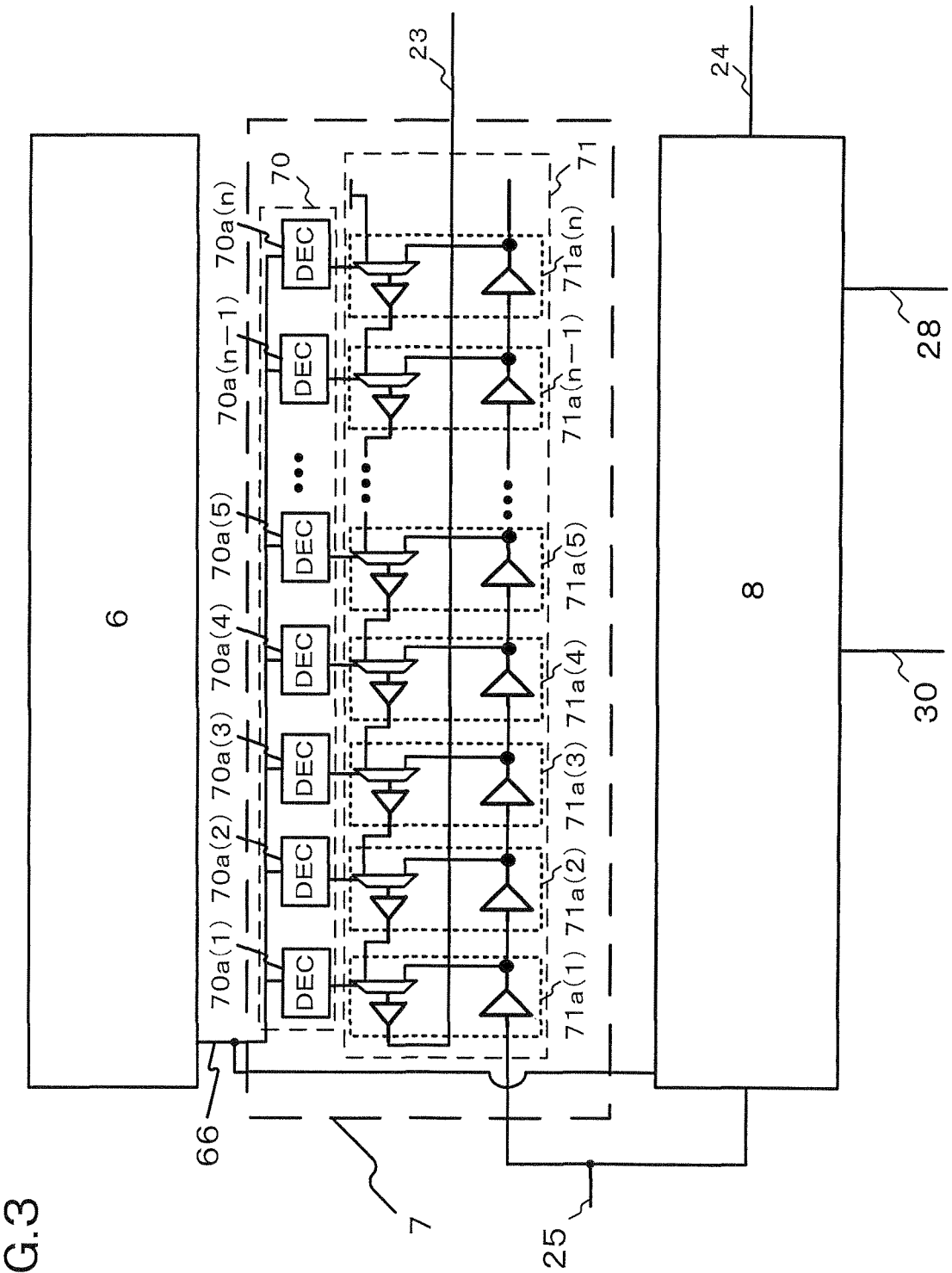
FIG. 3 is a circuit diagram illustrating a read data strobe signal delay circuit constituting the measurement circuit.

FIG. 3 is a circuit diagram illustrating the read data strobe signal delay circuit DLA 7 constituting the measurement circuit 17. For convenience of explanation of the read data strobe signal delay circuit DLA 7, FIG. 3 illustrates the DLL circuit 6, the detection circuit 8, and the read data strobe signal delay circuit DLA 7.

The read data strobe signal delay circuit DLA 7 is constituted by a selection circuit 70 and a delay circuit 71.

The delay circuit 71 is constituted by one row of series-connected circuit units 71a(1) to 71a(n). The circuit units 71a(1) to 71a(n) are circuits similar to the circuit units 60. However, the number of the circuit units 71a(1) to 71a(n) constituting the delay circuit 71 is one quarter the number of the circuit units 60 constituting the delay circuit 64.

The selection circuit 70 is constituted by decoding circuits 70a(1) to 70a(n). The decoding circuits 70a(1) to 70a(n) are circuits similar to the decoding circuits 63a(1) to 63a(n). Upon receipt of the decoding signal 66 supplied from the DLL circuit 6, a decoding circuit 70a(m) (m represents an integer number selected from 1 to n) of the selection circuit 70 corresponding to the decoding circuit 63a(m) (m represents an integer number selected from 1 to n) of the selection circuit 63 outputs the selection signal SELIN 56 to a circuit unit 71a(m) (m represents an integer number selected from 1 to n). As a result, the circuit units 71a(1) to 71a(m) contribute to the phase delay of the read data strobe (RDQS) signal 25.

Then, the read data strobe signal delay circuit DLA 7 outputs the delayed signal A23 by adding the phase delay of a quarter cycle of the clock signal 67 to the read data strobe (RDQS) signal 25. This is because the circuit unit 71a(m) (m represents an integer number selected from 1 to n) is a circuit similar to the circuit unit 60, and because the number of the circuit units 71a(1) to 71a(m) contributing to the signal delay in the read data strobe signal delay circuit DLA 7 is one quarter the number of the circuit units 60a(1) to 60a(m), 60b(1) to 60b(m), 60c(1) to 60c(m), and 60d(1) to 60d(m) (m represents an integer number selected from 1 to n) contributing to the signal delay in the DLL circuit 6. The reason the number of the circuit units is thus reduced to one quarter is because the number of the circuit units including the circuit unit 60a(m) connected to the single decoding circuit 63a(m) (m represents an integer number selected from 1 to n) is four times the number of the circuit unit 71a(m) connected to the single decoding circuit 70a(m) (m represents an integer number selected from 1 to n).

Figure 4:
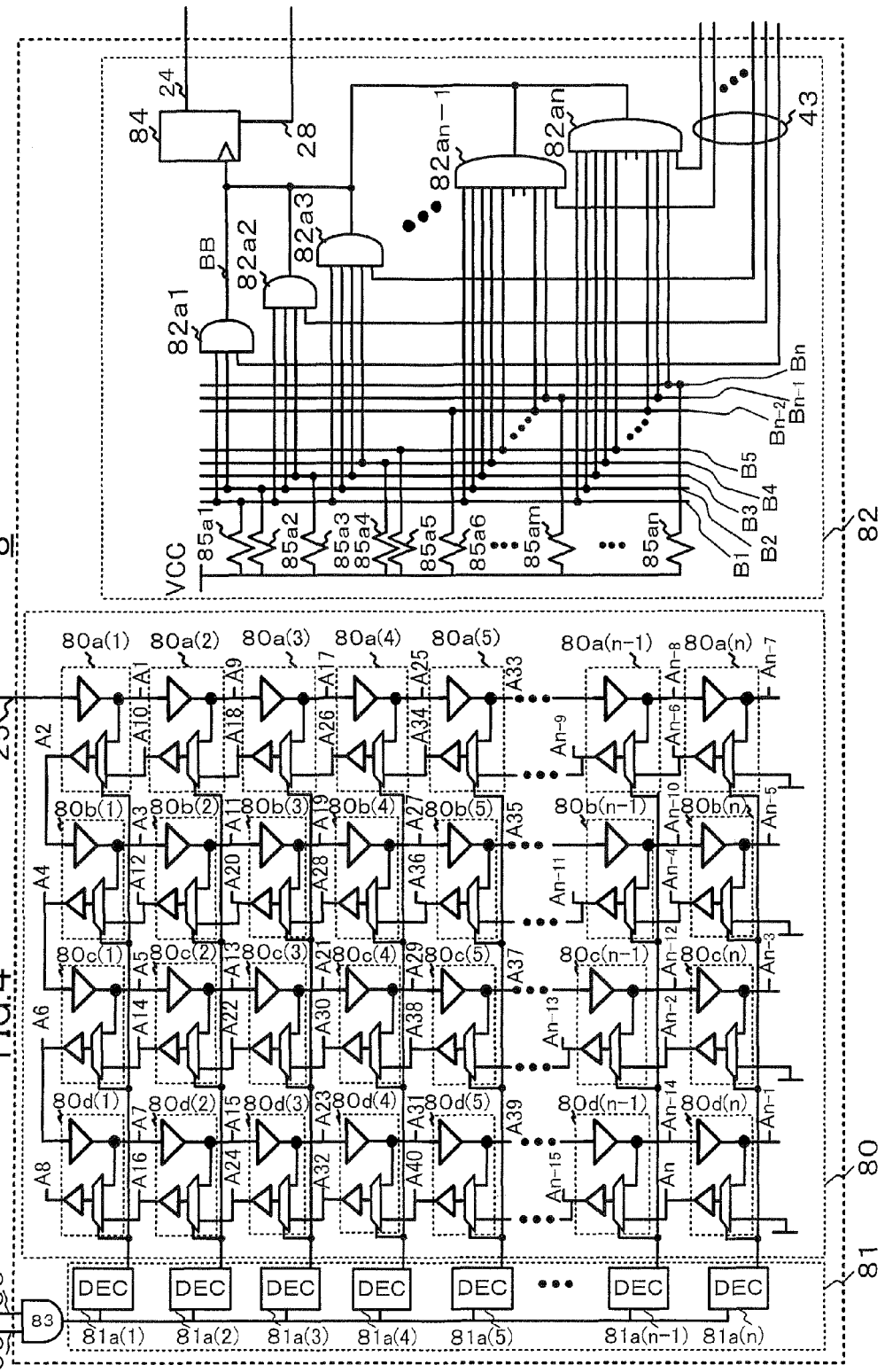
FIG. 4 is a circuit diagram illustrating a detection circuit constituting the measurement circuit.

FIG. 4 is a circuit diagram illustrating the detection circuit 8 constituting the measurement circuit 17. The detection circuit 8 is constituted by a delay circuit 80, a selection circuit 81, an L period detection circuit 82, and an AND circuit 83.

The delay circuit 80 is constituted by one row of circuit units 80a(1) to 80a(n), one row of circuit units 80b(1) to 80b(n), one row of circuit units 80c(1) to 80c(n), and one row of circuit units 80d(1) to 80d(n). That is, the circuit units 80a(1) to 80d(n) are similar to the circuit units 60. Thus, four rows of the series-connected circuit units 80a(1) to 80d(n) constitute the delay circuit 80. The above configuration is similar to the configuration of the delay circuit 64 of the DLL circuit 6.

The selection circuit 81 is constituted by decoding circuits 81a(1) to 81a(n). The decoding circuits 81a(1) to 81a(n) are circuits similar to the decoding circuits 63a(1) to 63a(n) of the DLL circuit 6.

The selection circuit 81 constitutes a circuit for outputting the selection signal SELIN 56 from one of the decoding circuits 81a(1) to 81a(n) upon receipt of the decoding signal 66 from the DLL circuit 6.

With the output of the selection signal SELIN 56, the selection circuit 81 acts on the delay circuit 80 such that the number of the circuit units 60 passed through by the read data strobe (RDQS) signal 25 becomes equal to the number of the circuit units 60 passed through by the clock signal 67 in the DLL circuit 6. The above action occurs because the selection circuit 81 directly uses the decoding signal 66 used in the DLL circuit 6, and thus the decoding circuit 81a(m) (m represents an integer number selected from 1 to n) corresponding to the decoding circuit 63a(m) (m represents an integer number selected from 1 to n) activated in the DLL circuit 6 is activated.

Accordingly, the amount of the delay caused by the circuit units 60 passed through by the read data strobe (RDQS) signal 25 corresponds to one cycle of the clock signal 67.

Nodes A1 to An of the delay circuit 80 are connected to signals provided in the L period detection circuit 82 described later.

The L period detection circuit 82 is constituted by AND circuits 82a1 to 82an for detecting the L period, a flip-flop circuit 84, pull-up resistors 85a1 to 85an, and wiring lines B1 to Bn. Respective outputs from the AND circuits 82a1 to 82an for detecting the L period are wired-OR together and output to a node BB. An AND circuit 82 am (m represents an integer number selected from 1 to n) includes the m+2 number of input terminals. One of the input terminals is connected to the Th signal 43 for selecting the AND circuit 82 am (m represents an integer number selected from 1 to n). Further, each of the remaining input terminals is connected to one of the wiring lines B1 to Bn.

The wiring lines B1 to Bn are wiring lines connected to the nodes A1 to An of the delay circuit 80.

The pull-up resistors 85a1 to 85an are high-value resistors for connecting a high potential power supply Vcc with the wiring lines B1 to Bn to prevent the logic of the wiring lines B1 to Bn from becoming unstable.

The AND circuits 82a1 to 82an for detecting the L period constitute circuits for receiving a part or the whole of the signals transmitted from the wiring lines B1 to Bn connected to the nodes A1 to An of the delay circuit 80, and detecting the L period of the read data strobe (RDQS) signal 25. The selection of the circuit to be activated from the AND circuits 82a1 to 82an is performed by the Th signal 43. As illustrated in FIG. 1, the Th signal 43 is a command signal input via the FIFO circuit 18 in accordance with the pre-Th signal 44 output from the DRAM controller 5. In this case, through the decoding signal 66, the DRAM controller 5 recognizes how many stages of the amplifiers causing the delay correspond to one cycle of the clock signal 67, or recognizes the decoding circuit 81a(m) (m represents an integer number selected from 1 to n) which outputs the selection signal SELIN 56. Then, the DRAM controller 5 outputs the pre-Th signal 44 in consideration of the length of the L period to be detected and the identification of the node passed through by the read data strobe (RDQS) signal 25 among the nodes A1 to An. As a result, the selected one of the AND circuits 82a1 to 82an can detect the predetermined L period.

Specifically, the L period of the read data strobe (RDQS) signal 25 is detected as follows. For example, if the logics of the signal transmitted from the wiring line B1, the signal transmitted from the wiring line B2, and the signal included in the Th signal 43 for selecting the AND circuit 82a1 are all the logic "L," the AND circuit 82a1 outputs a signal having the logic "L." In this case in which the AND circuit 82a1 outputs the signal having the logic "L," the logics of the nodes A1 and A2 of the delay circuit 80 are simultaneously the logic "L." Thus, when a logic "L" portion of the read data strobe (RDQS) signal 25 is propagated to the node A2, the node A1 maintains the logic "L." Therefore, the read data strobe (RDQS) signal 25 maintains the logic "L" during the propagation of the read data strobe (RDQS) signal 25 from the node A1 to the node A2.

Accordingly, the AND circuit 82a1 is assumed to have detected that the L period of the read data strobe (RDQS) signal 25 is equal to or longer than a period in which a signal passes through the circuit unit 80a(1). The period in which a signal passes through the circuit unit 80a(1) is equal to the period in which a signal passes through the circuit unit 60a(1) in the DLL circuit 6. Therefore, it is understood that, if the clock signal 67 and the delayed clock signal 65 have the same phase in the DLL circuit 6, and if one clock cycle is equal to the delay time of the k number of the circuit units 60, the L period of the read data strobe (RDQS) signal 25 is equal to or longer than the value "1 clock cycle/k."

In the AND circuit 82am (m represents an integer number selected from 1 to n), the m+1 number of input terminals thereof are connected to the m+1 number of nodes aligned along a delay path passed through by the read data strobe (RDQS) signal 25. Thus, similarly to the above, when the logics of the m+1 number of nodes are all "L," the AND circuit 82am (m represents an integer number selected from 1 to n) outputs the signal having the logic "L." The state in which the logics of the m+1 number of nodes are all "L" indicates that the logic of the read data strobe (RDQS) signal 25 is "L" during a period in which the read data strobe (RDQS) signal 25 passes through the circuit units 80a(1) to 80a(m), 80b(1) to 80b(m), 80c(1) to 80c(m), and 80d(1) to 80d(m) (m represents an integer number selected from 1 to n). That is, it is understood that, if one clock cycle is equal to the delay time of the k number of the circuit units 60, the L period of the read data strobe (RDQS) signal 25 is equal to or longer than the value "1 clock cyclexm/k."

Thereafter, when the logic rises from the logic "L" to the logic "H" at the time of input of the read data strobe (RDQS) signal 25 to the delay circuit 80, the AND circuit 82am (m represents an integer number selected from 1 to n) outputs a signal which rises from the logic "L" to the logic "H." That is, a signal indicating that the L period of the read data strobe (RDQS) signal 25 has been detected to be equal to or longer than the value "1 clock cyclexm/k" appears at the node BB.

The flip-flop circuit 84 constitutes a circuit for latching the logic "H" at the rise from the logic "L" to the logic "H" of the signal which has appeared at the node BB, and outputting to the node BB a signal having the logic "H". The flip-flop circuit 84 further constitutes a circuit for resetting the latch upon receipt of the reset signal 28. That is, the flip-flop circuit 84 is a so-called T flip-flop circuit.

With this configuration, the L period detection circuit 82 operates as follows. First, when the period of the logic "L" of the read data strobe (RDQS) signal 25 reaches a predetermined period, the AND circuits 82a1 to 82an for detecting the L period output the signal having the logic "L." Thereafter, at the time of the rise from the logic "L" to the logic "H" of the read data strobe (RDQS) signal 25, the signal appearing at the node BB rises from the logic "L" to the logic "H." Accordingly, the L period detection circuit 82 constitutes a circuit for outputting the signal having the logic "L" from a terminal thereof connected to the node BB when the detection circuit 8 starts detecting the L period of the read data strobe (RDQS) signal 25, and outputting the signal having the logic "H" from the terminal thereof connected to the node BB when the read data strobe (RDQS) signal 25 has maintained the logic "L" for a predetermined period.

When the logic of the start signal 30 is "L," the AND circuit 83 outputs the signal having the logic "L." Meanwhile, when the logic of the start signal 30 is "H," the AND circuit 83 outputs a logic signal in accordance with the logic of the decoding signal 66.

According to the above-described operations, the detection circuit 8 receives the start signal 30, and sets the delay path of one clock cycle in the delay circuit 80 in accordance with the decoding signal 66. Further, the detection circuit 8 receives the Th signal 43 to detect that the read data strobe (RDQS) signal 25 passing through the delay path has the predetermined logic "L" period. The predetermined logic "L" period is a period specified by the ratio thereof to one clock cycle. This is because the number of the circuit units, which is used to represent one clock, is also used to specify the period in which the read data strobe (RDQS) signal 25 maintains the logic "L."

Figure 5:
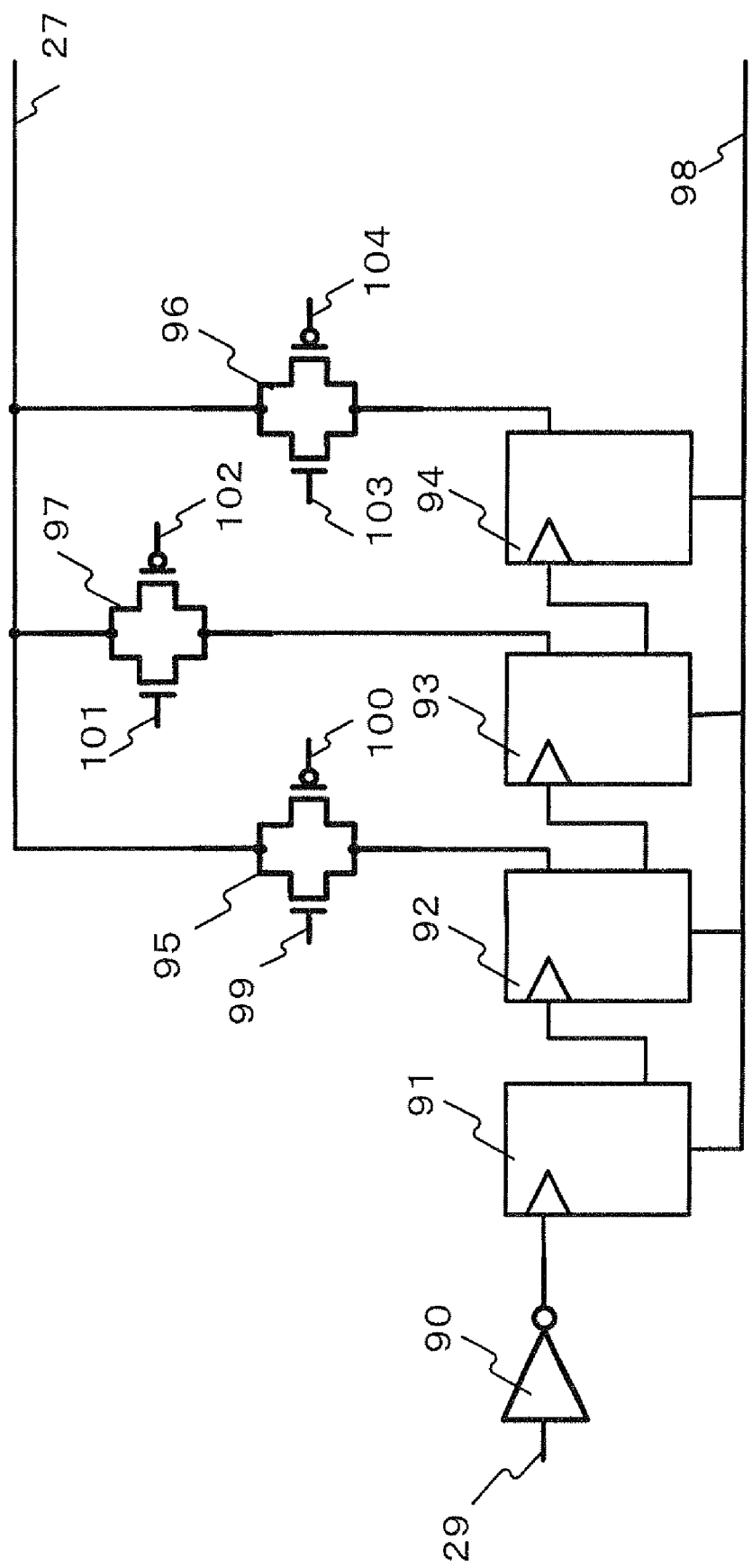
FIG. 5 is a circuit diagram illustrating a counter of a signal masking circuit according to a first embodiment.

FIG. 5 is a circuit diagram illustrating the counter 11 of the signal masking circuit 16 according to the first embodiment. The counter 11 is constituted by an inverter 90, T flip-flop circuits 91, 92, 93, and 94, and switch circuits 95, 96, and 97.

An input terminal of the inverter 90 is input with the masked read data strobe (MRDQS) signal 29. An output terminal of the inverter 90 is connected to a clock terminal of the T flip-flop circuit 91. An inverted data output terminal of the T flip-flop circuit 91 is connected to a clock terminal of the T flip-flop circuit 92. An inverted data output terminal of the T flip-flop circuit 92 is connected to a clock terminal of the T flip-flop circuit 93. A data output terminal of the T flip-flop circuit 92 is connected to an input terminal of the switch circuit 95. An inverted data output terminal of the T flip-flop circuit 93 is connected to a clock terminal of the T flip-flop circuit 94. A data output terminal of the T flip-flop circuit 93 is connected to an input terminal of the switch circuit 97. A data output terminal of the T flip-flop circuit 94 is connected to an input terminal of the switch circuit 96. Respective output terminals of the switch circuits 95, 96, and 97 are wired-OR together and connected to a terminal which outputs the END signal 27. Respective reset terminals of the T flip-flop circuits 91, 92, 93, and 94 are connected to an input terminal to which the counter reset signal 98 is input.

The counter 11 operates as follows. Upon input of the masked read data strobe (MRDQS) signal 29 to the inverter 90, the inverter 90 outputs an inverted signal of the signal. Then, in accordance with the fall of the masked read data strobe (MRDQS) signal 29, i.e., the rise of the inverted signal of the masked read data strobe (MRDQS) signal 29, the T flip-flop circuit 91 outputs an inverted data output signal. Then, when the inverted data output signal output from the T flip-flop circuit 91 is input to the clock terminal of the T flip-flop circuit 92, the T flip-flop circuit 92 outputs a data signal. In the switch circuit 95, if a terminal thereof for receiving a /BL2(99) signal is input with the logic "L," and if a terminal thereof for receiving the BL2(100) signal is input with the logic "H," the switch circuit 95 outputs the data signal received from the T flip-flop circuit 92 as the END signal 27. Further, when the inverted data output signal output from the T flip-flop circuit 91 is input to the clock terminal of the T flip-flop circuit 92, the T flip-flop circuit 92 also outputs an inverted data signal. When the inverted data output signal output from the T flip-flop circuit 92 is input to the clock terminal of the T flip-flop circuit 93, the T flip-flop circuit 93 outputs a data signal. In the switch circuit 97, if a terminal thereof for receiving a /BL4(101) signal is input with the logic "L," and if a terminal thereof for receiving the BL4(102) signal is input with the logic "H," the switch circuit 97 outputs the data signal received from the T flip-flop circuit 93 as the END signal 27. Further, when the inverted data output signal output from the T flip-flop circuit 92 is input to the clock terminal of the T flip-flop circuit 93, the T flip-flop circuit 93 also outputs an inverted data signal. When the inverted data output signal output from the T flip-flop circuit 93 is input to the clock terminal of the T flip-flop circuit 94, the T flip-flop circuit 94 outputs a data signal. In the switch circuit 96, if a terminal thereof for receiving a /BL8(103) signal is input with the logic "L," and if a terminal thereof for receiving the BL8(104) signal is input with the logic "H," the switch circuit 96 outputs the data signal received from the T flip-flop circuit 94 as the END signal 27.

The BL2(100) signal, the BL4(102) signal, the BL8(104) signal, and the counter reset signal 98 constitute the control signal 31 of FIG. 1. The control signal 31 is a signal output by the FIFO circuit 15 upon receipt of the control signal 32 output by the DRAM controller 5 and in accordance with the first rise of the masked read data strobe (MRDQS) signal 29.

Accordingly, the counter 11 is a circuit for outputting the END signal 27 when the number of counts of the falls of the masked read data strobe (MRDQS) signal 29 reaches the number counted by the T flip-flop circuit of the first stage to the T flip-flop circuit whose output terminal is selected by the BL2(100), BL4(102), or BL8(104) signal.

Herein, the number selected by the BL2(100), BL4(102), or BL8(104) signal is the number corresponding to a so-called burst length of the data output from the DRAM 1, e.g., an even integer number such as two, four, and eight. The burst length refers to the number of data sets continuously output by the DRAM 1. Needless to say, even if the number of data sets does not match the number selected by the BL2(100), BL4(102), or BL8(104) signal, the number corresponding to the burst length can be properly counted in an arbitrary command sequence, if read commands are continuously issued to the DRAM 1, and if the counter reset signal 98 is again output from the DRAM controller 5 at the time of issuance of a new read command.

FIG. 6 is a diagram for explaining the operations of the signal masking circuit 16. FIG. 6 illustrates a signal waveform 160 of the clock signal 67, a waveform 161 of the read data strobe (RDQS) signal 25, a waveform 162 of the gating signal B24, a waveform 163 of the delayed signal A23, and a waveform 164 of the masked read data strobe (MRDQS) signal 29.

As observed from the signal waveform 160, the clock signal 67 is a complementary signal constituted by a signal which repeats the logic "H" and the logic "L" on a predetermined cycle and an inverted signal of the signal. As observed from the waveform 161, the read data strobe (RDQS) signal 25 is a so-called bus signal. That is, the read data strobe (RDQS) signal 25 is a signal, the logic of which is defined during a period of the read data strobe (RDQS) signal 25 effective for receiving the read data, an approximately one clock cycle period of the logic "L" preceding the first rise of the read data strobe (RDQS) signal 25 effective for receiving the read data (a so-called read preamble), and an approximately 0.5 clock cycle period of the logic "L" subsequent to the last fall of the effective read data strobe (RDQS) signal 25 (a read postamble), and which is in the Hi-Z state in the other period. Further, as illustrated in the waveform 161 of FIG. 6, the period of the effective read data strobe (RDQS) signal 25 is a 1.5 clock cycle period starting near the time T4 and including two rises and two falls to enable the reception of four sets of the read data (DQ) 20, for example.

If the read data strobe (RDQS) signal 25 as described above is input to the signal masking circuit 16, the read data strobe signal delay circuit DLA 7 outputs the delayed signal A23 delayed in phase from the read data strobe (RDQS) signal 25 by a quarter clock cycle, as illustrated in the waveform 163 of FIG. 6.

Meanwhile, if the read data strobe (RDQS) signal 25 as described above is input to the detection circuit 8, the detection circuit 8 outputs the gating signal B24, as illustrated in the waveform 162 of FIG. 6. At the time T1, upon receipt of the start signal 30 for starting the detection of the logic "L" of the read data strobe (RDQS) signal 25 and the Th signal 43 for selecting the length of the logic "L" period to be detected, the detection circuit 8 starts the detection. Then, at the time T3 at which the logic "L" period of the read data strobe (RDQS) signal 25 reaches a predetermined period since the time T2 at which the read data strobe (RDQS) signal 25 has the logic "L," the detection circuit 8 outputs the gating signal B24 which rises from the logic "L" to the logic "H."

As a result, the masked read data strobe (MRDQS) signal 29 is output from the AND circuit 10, as illustrated in the waveform 164 of FIG. 6. This is because the signal masking circuit 16 operates as follows. First, a terminal of the AND circuit 9 is input with the gating signal B24, and the other terminal of the AND circuit 9 is input with the delayed signal A23. Accordingly, the AND circuit 9 outputs the delayed signal C26. The delayed signal C26 is input to a terminal of the AND circuit 10, and the END signal 27 output from the counter 11 is input to the other terminal of the AND circuit 10. As described in the explanation of FIG. 5, the END signal 27 is the signal, logic of which is set to "L" by the counter reset signal 98 at the start of the counting operation. Thus, the AND circuit 10 outputs the delayed signal C26 as the masked read data strobe (MRDQS) signal 29. Therefore, the masked read data strobe (MRDQS) signal 29 is a signal which starts near the time T4, twice repeats the rise from the logic "L" to the logic "H" and the fall from the logic "H" to the logic "L," and thereafter maintains the logic "L" to enable the reception of four sets of the read data (DQ) 20.

In this case, the masked read data strobe (MRDQS) signal 29 returns to the logic "L" for the following reason. After having detected the second fall from the logic "H" to the logic "L" in the masked read data strobe (MRDQS) signal 29, the counter 11 outputs the reset signal 28 to the detection circuit 8 to set the output from the flip-flop circuit 84 of the detection circuit 8 (the gating signal B24) to the logic "L." As a result, the delayed signal C26 is also fixed to the logic "L" by the AND circuit 9, and the masked read data strobe (MRDQS) signal 29 is fixed to the logic "L" by the AND circuit 10.

The signal masking circuit 16 operates as described above. Therefore, the masked read data strobe (MRDQS) signal 29 is prevented from falling into the Hi-Z state, and an illegal pulse is suppressed at the clock terminal of the flip-flop circuit 12. In the flip-flop circuit 12 illustrated in FIG. 1, therefore, the logic of the latched read data (DQ) 20 is not destroyed.

Figures 7A, 7B:
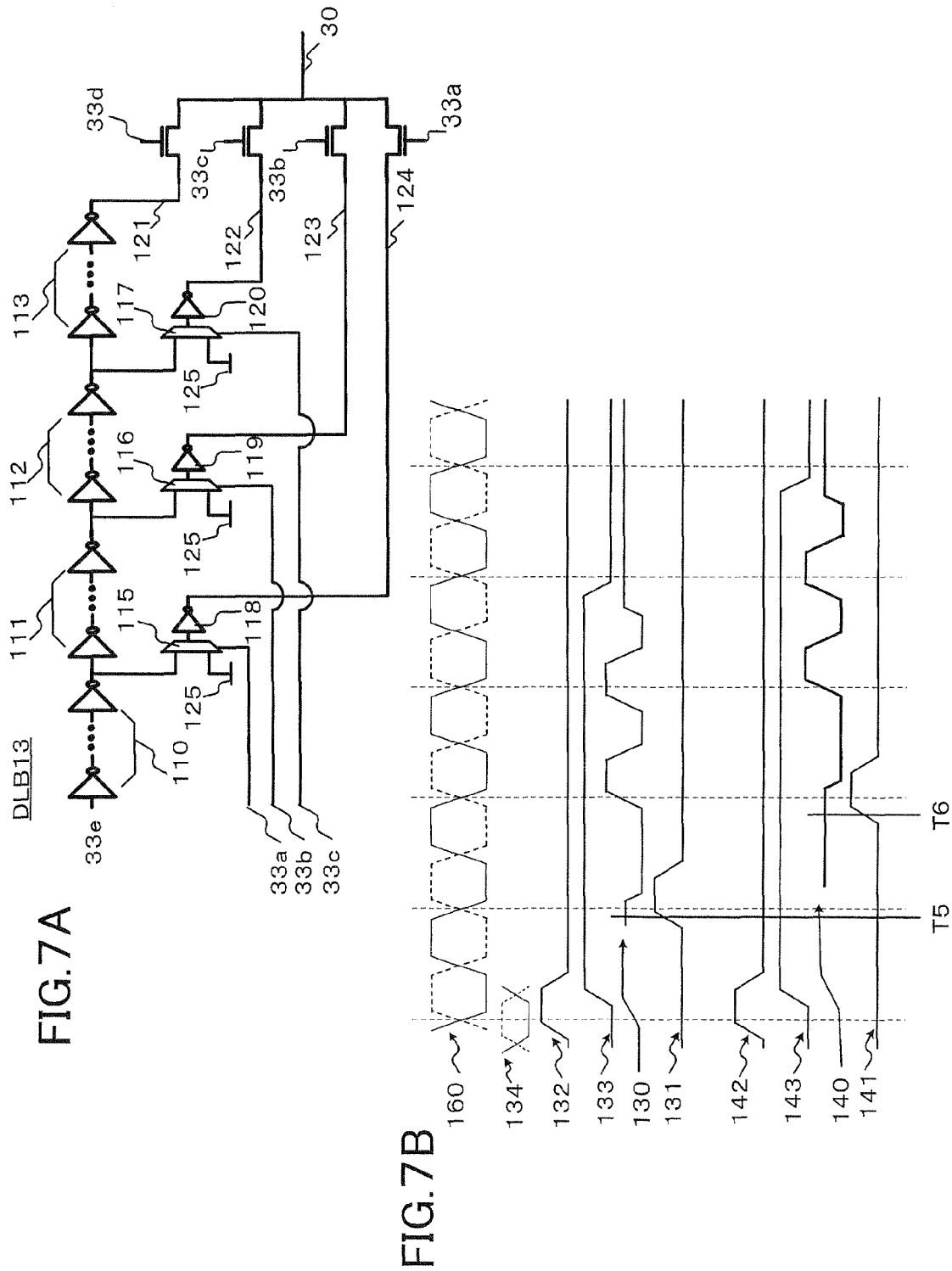
FIGS. 7A and 7B are diagrams for explaining a signal delay circuit.

FIGS. 7A and 7B are diagrams for explaining the signal delay circuit DLB 13. FIG. 7A illustrates a circuit diagram of the signal delay circuit DLB 13. The signal delay circuit DLB 13 is constituted by inverter strings 110, 111, 112, and 113, switch circuits 115, 116, and 117 constituting circuit units, inverters 118, 119, and 120, and MOS (Metal Oxide Semiconductor) transistors 121, 122, 123, and 124. Further, the signal delay circuit DLB 13 constitutes a circuit for receiving the pre-start signal 33 and outputting the start signal 30. The pre-start signal 33 is constituted by select signals 33a, 33b, 33c, and 33d, and a pre-start G signal 33e.

The pre-start G signal 33e is connected to an input terminal of the inverter string 110, and an output terminal of the inverter string 110 is connected to an input terminal of the switch circuit 115 and an input terminal of the inverter string 111. An output terminal of the inverter string 111 is connected to an input terminal of the switch circuit 116 and an input terminal of the inverter string 112. An output terminal of the inverter string 112 is connected to an input terminal of the switch circuit 117 and an input terminal of the inverter string 113. An output terminal of the inverter string 113 is connected via the MOS transistor 121 to a terminal which outputs the start signal 30. A gate electrode of the MOS transistor 121 is connected to the select signals 33d.

The other input terminal of the switch circuit 115 is connected to a ground power supply VSS 125, and a switch terminal of the switch circuit 115 is connected to the select signal 33a. Further, an output terminal of the switch circuit 115 is connected to an input terminal of the inverter 118. An output terminal of the inverter 118 is connected via the MOS transistor 124 to the terminal which outputs the start signal 30. A gate electrode of the MOS transistor 124 is connected to the select signal 33a.

The other input terminal of the switch circuit 116 is connected to the ground power supply VSS 125, and a switch terminal of the switch circuit 116 is connected to the select signal 33b. Further, an output terminal of the switch circuit 116 is connected to an input terminal of the inverter 119. An output terminal of the inverter 119 is connected via the MOS transistor 123 to the terminal which outputs the start signal 30. A gate electrode of the MOS transistor 123 is connected to the select signal 33b.

The other input terminal of the switch circuit 117 is connected to the ground power supply VSS 125, and a switch terminal of the switch circuit 117 is connected to the select signal 33c. Further, an output terminal of the switch circuit 117 is connected to an input terminal of the inverter 120. An output terminal of the inverter 120 is connected via the MOS transistor 122 to the terminal which outputs the start signal 30. A gate electrode of the MOS transistor 122 is connected to the select signal 33c.

In this configuration, if the pre-start G signal 33e is input to the inverter string 110 and the logic of the select signal 33a is set to "H," a delayed signal of the pre-start G signal 33e output by the inverter string 110 is output by the switch circuit 115 to the MOS transistor 124, and is made to pass through the output terminal of the start signal 30 by the MOS transistor 124.

If the pre-start G signal 33e is input to the inverter string 110 and the logic of the select signal 33b is set to "H," a delayed signal of the pre-start G signal 33e output by the inverter string 111 is output by the switch circuit 116 to the MOS transistor 123, and is made to pass through the output terminal of the start signal 30 by the MOS transistor 123.

If the pre-start G signal 33e is input to the inverter string 110 and the logic of the select signal 33c is set to "H," a delayed signal of the pre-start G signal 33e output by the inverter string 112 is output by the switch circuit 117 to the MOS transistor 122, and is made to pass through the output terminal of the start signal 30 by the MOS transistor 122.

If the pre-start G signal 33e is input to the inverter string 110 and the logic of the select signal 33d is set to "H," a delayed signal of the pre-start G signal 33e output by the inverter string 113 is output to the MOS transistor 121, and is made to pass through the output terminal of the start signal 30 by the MOS transistor 121.

The inverter strings 110, 111, 112, and 113 add to a signal passing therethrough a phase delay corresponding to approximately one clock cycle of the clock signal 67.

FIG. 7B is a diagram for explaining operations of the signal delay circuit DLB 13. FIG. 7B illustrates the waveform 160 of the clock signal 67, a waveform 134 of a command signal, waveforms 132 and 142 of the pre-start G signal 33e, a waveform 133 of the select signal 33a, a waveform 143 of the select signal 33b, a waveform 130 of the read data strobe (RDQS) signal 25 output by the DRAM 1 in a DL1 operation mode, a waveform 140 of the read data strobe (RDQS) signal 25 output by the DRAM 1 in a DL2 operation mode, and waveforms 131 and 141 of the start signal 30. Herein, the DL1 operation mode refers to the mode in which the data latency is two clocks. Similarly, the DL2 operation mode refers to the mode in which the data latency is three clocks. Further, the data latency refers to the period from the receipt of a command by the DRAM 1 until the output of data, which is expressed by the number of clocks.

Therefore, the read preamble of the read data strobe (RDQS) signal 25 illustrated in the waveform 130 starts one clock after the read command. Meanwhile, the read preamble of the read data strobe (RDQS) signal 25 illustrated in the waveform 140 starts two clocks after the read command. This is because the read preamble starts one clock before the effective period of the read data strobe (RDQS) signal 25 for acquiring the read data.

In this case, the DRAM controller 5 recognizes that the DRAM 1 is operating in the DL2 operation mode. Thus, immediately after the output to the DRAM 1 of the read command illustrated in the waveform 134, the DRAM controller 5 outputs to the memory interface circuit 4 the pre-start G signal 33e illustrated in the waveform 132 and the select signal 33a illustrated in the waveform 133. As a result, the internal circuits of the signal delay circuit DLB 13 operate as described in the explanation of FIG. 7A. Thus, after approximately one clock cycle, the signal delay circuit DLB 13 outputs, as the start signal 30, the signal output from the switch circuit 115 selected by the select signal 33a, as illustrated in the waveform 131. Consequently, at the time T5, the detection circuit 8 starts detecting the logic "L" period of the read data strobe (RDQS) signal 25.

Meanwhile, when the DRAM 1 is operating in a DL3 operation mode, the DRAM controller 5 recognizes the operation of the DRAM 1 in the mode. Thus, immediately after the output to the DRAM 1 of the read command illustrated in the waveform 134, the DRAM controller 5 outputs to the memory interface circuit 4 the pre-start G signal 33e illustrated in the waveform 142 and the select signal 33b illustrated in the waveform 143. As a result, the internal circuits of the signal delay circuit DLB 13 operate as described in the explanation of FIG. 7A. Thus, after approximately two clock cycles, the signal delay circuit DLB 13 outputs, as the start signal 30, the signal output from the switch circuit 116 selected by the select signal 33b, as illustrated in the waveform 141. Consequently, at the time T6, the detection circuit 8 starts detecting the logic "L" period of the read data strobe (RDQS) signal 25.

FIG. 8 illustrates operation waveforms of the DRAM 1 and the memory interface circuit 4. In the DRAM 1, the data latency thereof is set to three clocks, and the burst length thereof is set to output four sets of continuous data. As observed from the waveform 160 of the clock signal 67 and a signal waveform 165 of a read command, upon input of the clock signal 67 and the read command to the DRAM 1 at the time T7, the DRAM 1 outputs four sets of the continuous read data (DQ) 20 (a signal waveform 180) at the third clock of the clock signal 67 counted from the rise of the clock signal 67 at which the DRAM 1 receives the read command. Further, as observed from a signal waveform 170 of the read data strobe (RDQS) signal 25, in accordance with the four sets of the continuous data, the DRAM 1 outputs the read data strobe (RDQS) signal 25 which has the read preamble period starting at the time T8 and which includes two rises and two falls in a period from the time T9 to the time T10.

Meanwhile, as observed from a signal waveform 190 of the delayed signal A23, the delayed signal A23 delayed from the read data strobe (RDQS) signal 25 by a quarter cycle is output in the memory interface circuit 4 to enable the read data (DQ) 20 to be acquired in accordance with the read data strobe (RDQS) signal 25. Further, as observed from a signal waveform 200 of the gating signal B24, the logic "L" period of the read data strobe (RDQS) signal 25 is detected by the detection circuit 8, and the gating signal B24 for gating the read data strobe (RDQS) signal 25 is output from the read data strobe (RDQS) signal 25 itself during the period from the time T9 to the time T10. Further, as observed from a signal waveform 210 of the masked read data strobe (MRDQS) signal 29, the masked read data strobe (MRDQS) signal 29 obtained through the gating of the delayed signal A23 performed by the gating signal B24 is output during the period from the time T9 to the time T10.

Accordingly, the memory interface circuit 4 has the following advantages. First, the read data (DQ) 20 is latched by the flip-flop circuit 12 of the memory interface circuit 4 in synchronization with the rise and fall of the masked read data strobe (MRDQS) signal 29.

As described above, the delayed signal A23 and the gating signal B24 are obtained from the read data strobe (RDQS) signal 25. Thus, due to the gating of the delayed signal A23 performed by the gating signal B24, the effective period of the read data strobe (RDQS) signal 25 is not reduced. This is because what triggers the operation of the delayed signal A23 and the gating signal B24 is the read data strobe (RDQS) signal 25 itself, which is propagated through the flight path. Therefore, the phase relationship in which the delayed signal A23 is gated by the gating signal B24 is kept constant, unaffected by the flight time, unlike the conventional technique. Accordingly, reliable gating unaffected by the signal delay is guaranteed.

As a result, the read data (DQ) 20 is reliably latched by the flip-flop circuit 12 of the memory interface circuit 4. Further, the masked read data strobe (MRDQS) signal 29 does not have the Hi-Z period. Therefore, the data latched by the flip-flop circuit 12 is not destroyed.

According to the conventional circuit, the signal delay (the so-called flight time) is not constant in the period in which the clock signal 67 of the logic circuit is transmitted to the DRAM 1 and the read data strobe (RDQS) signal 25 is generated and transmitted to the logic circuit through the signal path. In the conventional circuit, therefore, the timing of gating the read data strobe (RDQS) signal 25 is affected by the length of the signal delay, depending on the clock signal 67 of the logic circuit.

In view of the above, if the timing of gating the read data strobe (RDQS) signal 25 is set within the read preamble and the read postamble to prevent the flip-flop circuit 12 from latching the incorrect read data (DQ) 20, the effective period of the read data strobe (RDQS) signal 25 is reduced due to the non-constant signal delay (flight time). As a result, the reduction in the effective period of the signal forms an obstacle to an increase in the speed of a DDR-type DRAM interface.

What is claimed is:

1. A signal masking circuit comprising:
    a detection circuit for detecting a period of a logic "L (Low)" preceding a period of a read data strobe signal effective for receiving read data, and generating a gating signal when the period of the logic "L" is equal to or longer than a predetermined period;
    a delayed read data strobe signal generation circuit for generating a delayed read data strobe signal by delaying the read data strobe signal;
    a gating circuit for gating the delayed read data strobe signal upon receipt of the gating signal, and generating a first masked read data strobe signal;
    a counting circuit for counting falls of the first masked read data strobe signal after the gating until counts counted by the counting circuit reaches a predetermined number, and generating a masking signal for masking the first masked read data strobe signal after the counting; and
    a masking circuit for masking the first masked read data strobe signal upon receipt of the masking signal, and outputting a second masked read data strobe signal.

2. The signal masking circuit according to claim 1, further comprising a DLL (Delay Lock Loop) circuit including
a first delay circuit storing a delay time corresponding to one clock of a clock signal in the number of stages of the first delay elements causing a delay corresponding to the delay time when the clock signal is input to the first delay circuit, including a plurality of series-connected first delay elements; and
a digital signal generation circuit for generating a digital signal in accordance with the number of stages of the first delay elements stored by the first delay circuit,
wherein the detection circuit receives the digital signal to recognize the delay time from the number of stages of the first delay elements, and the predetermined period is specified by the ratio of the predetermined period to the delay time.

3. The signal masking circuit according to claim 2,
wherein the detection circuit comprises
a second delay circuit including a plurality of series-connected second delay elements, and receiving the digital signal to select the second delay elements to be passed through by the read data strobe signal such that the delay time becomes equal to the sum of delays provided by the second delay elements to the read data strobe signal input to the second delay circuit, and
a gating signal generation circuit for generating the gating signal when, among the selected second delay elements, the number of the second delay elements outputting the logic "L" reaches a predetermined number.

4. The signal masking circuit according to claim 3,
wherein the delayed read data strobe signal generation circuit includes a third delay circuit including a plurality of series-connected third delay elements, and receiving the digital signal to select the third delay elements to be passed through by the read data strobe signal such that one quarter of the delay time becomes equal to the sum of delays provided by the third delay elements to the read data strobe signal input to the third delay circuit.

5. A semiconductor integrated circuit having the signal masking circuit as described according to claim 2, the semiconductor integrated circuit comprising:
a start signal generation circuit for outputting a start signal to the detection circuit to start the detection of the period of the logic "L" preceding the period of the read data strobe signal effective for receiving the read data; and
a ratio selection signal generation circuit for generating to the detection circuit a signal for selecting the ratio of the predetermined period to the delay time.

6. The semiconductor integrated circuit according to claim 5, including a first latch circuit for latching the read data in accordance with the second masked read data strobe signal and outputting first data including a logic according to the logic of the read data.

7. The semiconductor integrated circuit according to claim 6, including a second latch circuit for providing a semiconductor device operating in synchronization with the clock signal with second data including a logic according to the logic of the first data,
wherein the second latch circuit latches the first data in accordance with the clock signal.

8. The semiconductor integrated circuit according claim 7, including a third latch circuit for latching a first setting signal transmitted from the semiconductor device in accordance with the second masked read data strobe signal and outputting to the counting circuit a second setting signal according to the first setting signal,
wherein the predetermined number in the counting circuit is set by the second setting signal.

9. A semiconductor integrated circuit having the signal masking circuit according to claim 1, the semiconductor integrated circuit comprising:
a start signal generation circuit for outputting a start signal to the detection circuit to start the detection of the period of the logic "L" preceding the period of the read data strobe signal effective for receiving the read data.

10. The semiconductor integrated circuit according to claim 9, including a first latch circuit for latching the read data in accordance with the second masked read data strobe signal and outputting first data including a logic according to the logic of the read data.

11. The semiconductor integrated circuit according to claim 10, including a second latch circuit for providing a semiconductor device operating in synchronization with the clock signal with second data including a logic according to the logic of the first data,
wherein the second latch circuit latches the first data in accordance with the clock signal.

12. The semiconductor integrated circuit according claim 11, including a third latch circuit for latching a first setting signal transmitted from the semiconductor device in accordance with the second masked read data strobe signal and outputting to the counting circuit a second setting signal according to the first setting signal,
wherein the predetermined number in the counting circuit is set by the second setting signal.

13. A signal masking method comprising:
detecting a period of a logic "L" preceding a period of a read data strobe signal effective for receiving read data after a lapse of a set period since the rise of a clock signal at which a read command is received;
generating a delayed read data strobe signal by delaying the read data strobe signal;
generating a gating signal for gating the delayed read data strobe signal after the period of the logic "L" has reached a predetermined length;
generating a masked read data strobe signal by gating the delayed read data strobe signal with the gating signal,
counting of the falls of the masked read data strobe signal after the generating a mask read data strobe signal;
generating a masking signal for masking the delayed read data strobe signal when the number of counts of the falls of the masked read data strobe signal has reached a predetermined number; and
masking the delayed read data strobe signal with the masking signal to set the logic of the masked read data strobe signal to a fixed value.

14. The signal masking method according to 13, wherein the predetermined length is specified by the ratio the predetermined length to one cycle of the clock signal.

* * * * *